United States Patent
Farkas et al.

(10) Patent No.: US 10,859,461 B2
(45) Date of Patent: Dec. 8, 2020

(54) METHOD AND APPARATUS FOR DIGITAL LEAK DETECTION IN LIQUID-COOLED INFORMATION HANDLING SYSTEMS

(71) Applicant: DELL PRODUCTS, LP, Round Rock, TX (US)

(72) Inventors: Sandor Farkas, Round Rock, TX (US); Michael J. Stumpf, Cedar Park, TX (US); Desmond Awungayi, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 78 days.

(21) Appl. No.: 16/400,920

(22) Filed: May 1, 2019

(65) Prior Publication Data
US 2020/0348202 A1    Nov. 5, 2020

(51) Int. Cl.
*G08B 21/00*    (2006.01)
*G01M 3/16*    (2006.01)
(Continued)

(52) U.S. Cl.
CPC ............... *G01M 3/16* (2013.01); *G06F 1/20* (2013.01); *G08B 21/18* (2013.01); *H01P 3/081* (2013.01);
(Continued)

(58) Field of Classification Search
CPC . G01M 3/16; G06F 1/20; G08B 21/18; H01P 3/081; H04B 1/16; H05K 1/0243; H05K 1/0245
See application file for complete search history.

(56) References Cited

U.S. PATENT DOCUMENTS 3,783,414 A * 1/1974 Klein ............... H01P 1/262
                                              333/22 F
5,656,771 A * 8/1997 Beswick ............ F01P 11/14
                                              73/114.68
(Continued)

FOREIGN PATENT DOCUMENTS

WO    WO 2008/0124889 A1    10/2008

OTHER PUBLICATIONS

U.S. Appl. No. 16/148,507, filed Oct. 1, 2018.

*Primary Examiner* — Quang Pham
(74) *Attorney, Agent, or Firm* — Larson Newman, LLP

(57) ABSTRACT

An apparatus includes a transmitter circuit configured to provide a transmitted waveform at a transmitter output, and a first microstrip differential trace extending from a first microstrip differential trace first end to a first microstrip differential trace second end. A first resistor has a first resistor first end coupled to the transmitter output and a first resistor second end coupled to the first microstrip differential trace first end. A second microstrip differential trace extends from a second microstrip differential trace first end to a second microstrip differential trace second end. A second resistor has a second resistor first end coupled to the transmitter output and a second resistor second end coupled to the second microstrip differential trace first end. A first receiver circuit has a first receiver circuit input coupled to the first microstrip differential trace second end, the first receiver configured to provide a first received signal. A second receiver circuit has a second receiver circuit input coupled to the second microstrip differential trace second end, the second receiver configured to provide a second received signal. A processor may receive the first received signal and the second received signal and perform digital signal processing on the first received signal and the second received (Continued)

signal, detect a coolant leak, and provide an alert upon detection of the coolant leak.

20 Claims, 9 Drawing Sheets

(51) Int. Cl.
    *H01P 3/08*     (2006.01)
    *H05K 1/02*     (2006.01)
    *H04B 1/16*     (2006.01)
    *G06F 1/20*     (2006.01)
    *G08B 21/18*     (2006.01)

(52) U.S. Cl.
    CPC ............. *H04B 1/16* (2013.01); *H05K 1/0243* (2013.01); *H05K 1/0245* (2013.01)

(56) References Cited

U.S. PATENT DOCUMENTS

| | | | |
|---|---|---|---|
| 6,028,313 A * | 2/2000 | McDaniel | G01T 1/1642 250/338.4 |
| 6,707,307 B1 | 3/2004 | McFarlane et al. | |
| 8,325,411 B2 | 12/2012 | Higginson et al. | |
| 8,358,505 B2 * | 1/2013 | Toftloekke | H01L 23/473 361/703 |
| 2003/0201158 A1 * | 10/2003 | Andberg | G01M 3/165 200/61.04 |
| 2004/0160741 A1 * | 8/2004 | Moss | G06F 1/20 361/699 |
| 2004/0188069 A1 * | 9/2004 | Tomioka | G06F 1/206 165/104.33 |
| 2005/0243510 A1 * | 11/2005 | Tomioka | G06F 1/203 361/679.52 |
| 2006/0187638 A1 * | 8/2006 | Vinson | H05K 7/20009 361/698 |
| 2008/0003471 A1 * | 1/2008 | Beliveau | H01M 8/04186 429/416 |
| 2008/0143540 A1 * | 6/2008 | Savla | F16K 35/06 340/605 |
| 2009/0066342 A1 * | 3/2009 | Lemson | H01J 37/32935 324/601 |
| 2012/0106083 A1 * | 5/2012 | Toftloekke | F28D 15/0266 361/698 |
| 2012/0251859 A1 * | 10/2012 | Payne | H01M 10/482 429/90 |
| 2013/0058038 A1 * | 3/2013 | Alyaser | H05K 7/20254 361/679.53 |
| 2014/0015511 A1 * | 1/2014 | Matthe | H01M 10/613 324/71.1 |
| 2014/0190241 A1 * | 7/2014 | Namou | G01L 1/2262 73/40 |
| 2014/0251583 A1 * | 9/2014 | Eriksen | F28F 3/12 165/104.33 |
| 2016/0025403 A1 * | 1/2016 | Krainer | F25D 21/02 62/81 |
| 2016/0178475 A1 * | 6/2016 | Krishnan | H05K 7/20772 324/713 |
| 2016/0281704 A1 * | 9/2016 | Lyon | G05B 17/02 |
| 2017/0160761 A1 * | 6/2017 | Chan | H02J 1/06 |
| 2017/0181321 A1 * | 6/2017 | Shelnutt | H05K 7/20781 |
| 2017/0181322 A1 * | 6/2017 | Shelnutt | H05K 7/20627 |
| 2017/0181323 A1 * | 6/2017 | Shelnutt | H05K 7/20772 |
| 2017/0181324 A1 * | 6/2017 | Shelnutt | H05K 7/20781 |
| 2017/0181329 A1 | 6/2017 | Shelnutt et al. | |
| 2018/0341301 A1 * | 11/2018 | Shabbir | H05K 7/20836 |
| 2020/0053916 A1 * | 2/2020 | Bonnin | H05K 7/20836 |
| 2020/0103307 A1 * | 4/2020 | Farkas | G01M 3/165 |

* cited by examiner

METHOD AND APPARATUS FOR DIGITAL LEAK DETECTION IN LIQUID-COOLED INFORMATION HANDLING SYSTEMS

FIELD OF THE DISCLOSURE

The present disclosure generally relates to information handling systems, and more particularly relates to coolant leak detection in information handling systems.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An apparatus includes a transmitter circuit configured to provide a transmitted waveform at a transmitter output, and a first microstrip differential trace extending from a first microstrip differential trace first end to a first microstrip differential trace second end. A first resistor has a first resistor first end coupled to the transmitter output and a first resistor second end coupled to the first microstrip differential trace first end. A second microstrip differential trace extends from a second microstrip differential trace first end to a second microstrip differential trace second end. A second resistor has a second resistor first end coupled to the transmitter output and a second resistor second end coupled to the second microstrip differential trace first end. A first receiver circuit has a first receiver circuit input coupled to the first microstrip differential trace second end, the first receiver configured to provide a first received signal. A second receiver circuit has a second receiver circuit input coupled to the second microstrip differential trace second end, the second receiver configured to provide a second received signal. A processor may receive the first received signal and the second received signal and perform digital signal processing on the first received signal and the second received signal, detect a coolant leak, and provide an alert upon detection of the coolant leak.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
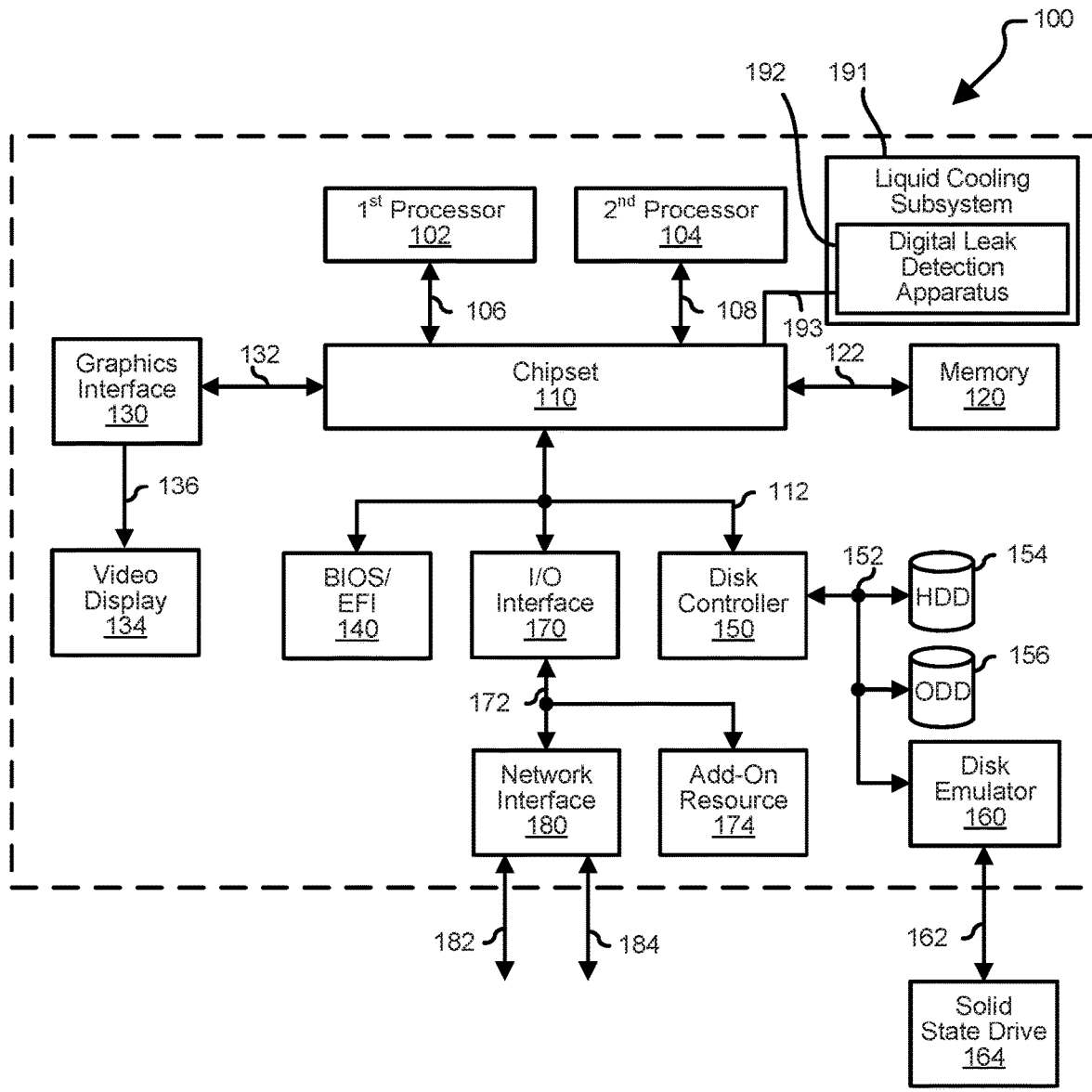
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, a network interface 180, and a liquid cooling subsystem 191. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Liquid cooling subsystem 191 comprises a digital leak detection apparatus 192. Digital leak detection apparatus 192 is connected to chipset 110 via interface 193.

As CPU power continues to increase, liquid cooling is expected to be more common. Liquid cooling systems circulate water in a closed loop inside electronics enclosures, which include fittings and joints and hoses to complete the loop. These parts can develop leaks over time due to vibration, thermal cycles or aging. Any leaks would result in water in the system that can cause corrosion or damage to circuitry, therefore a method and apparatus to detect leaks are provided as described herein.

In accordance with at least one embodiment, inexpensive and reliable moisture sensors using resistively driven exposed circuit board traces can be assessed using digital signal processing (DSP) to detect leaks. This can provide a very low cost and reliable solution. A microstrip differential trace sensing element is fabricated and placed at an area that is likely prone to leaks. As an example, this may be near the hose fittings. The moisture sensing trace will not be covered by solder mask so it can be exposed to leaking coolant and humidity from air. In the presence of water, the impedance across the traces decreases.

To cancel out variations in components and board manufacturing and humidity changes in the environment, a second microstrip differential element is provided and is used as reference. This moisture sensing trace will be placed where a leak is not expected. This trace will not be covered by solder mask so it can be exposed to humidity from air.

In accordance with at least one embodiment, exposed traces will be gold plated to prevent corrosion. One trace of each pair will be connected to a reference potential, such as a ground voltage, so voltages can be measured with single ended measurements from a low-cost microcontroller unit (MCU).

Both pairs are driven from the MCU through a resistance-capacitance (RC) low-pass filter and a resistor, forming a voltage divider with the sensors. Water is slightly conductive, so wet traces will have lower impedance. Two analog-to-digital converters (ADCs) will sample the voltage on the traces. MCU firmware (FW) will be executed by the MCU to monitor the change of peak voltages that correlate to impedances. The MCU compares readings between sensors, and asserts alert if there is a leak.

A circuit board for the digital leak detection apparatus may be installed on a base plate, such as a cold plate. The coolant contains surfactant additives that cause the liquid to spread quickly once in contact with the printed circuit board (PCB). The sensor traces are grouped into zones that correspond to areas isolated from one another, for example, using a solder mask, a silk screen printing, or both on the upper surface of the circuit board to establish barriers between the areas to discourage fluid travel across zones, in order to maximize the delta between sensors.

Figure 2:
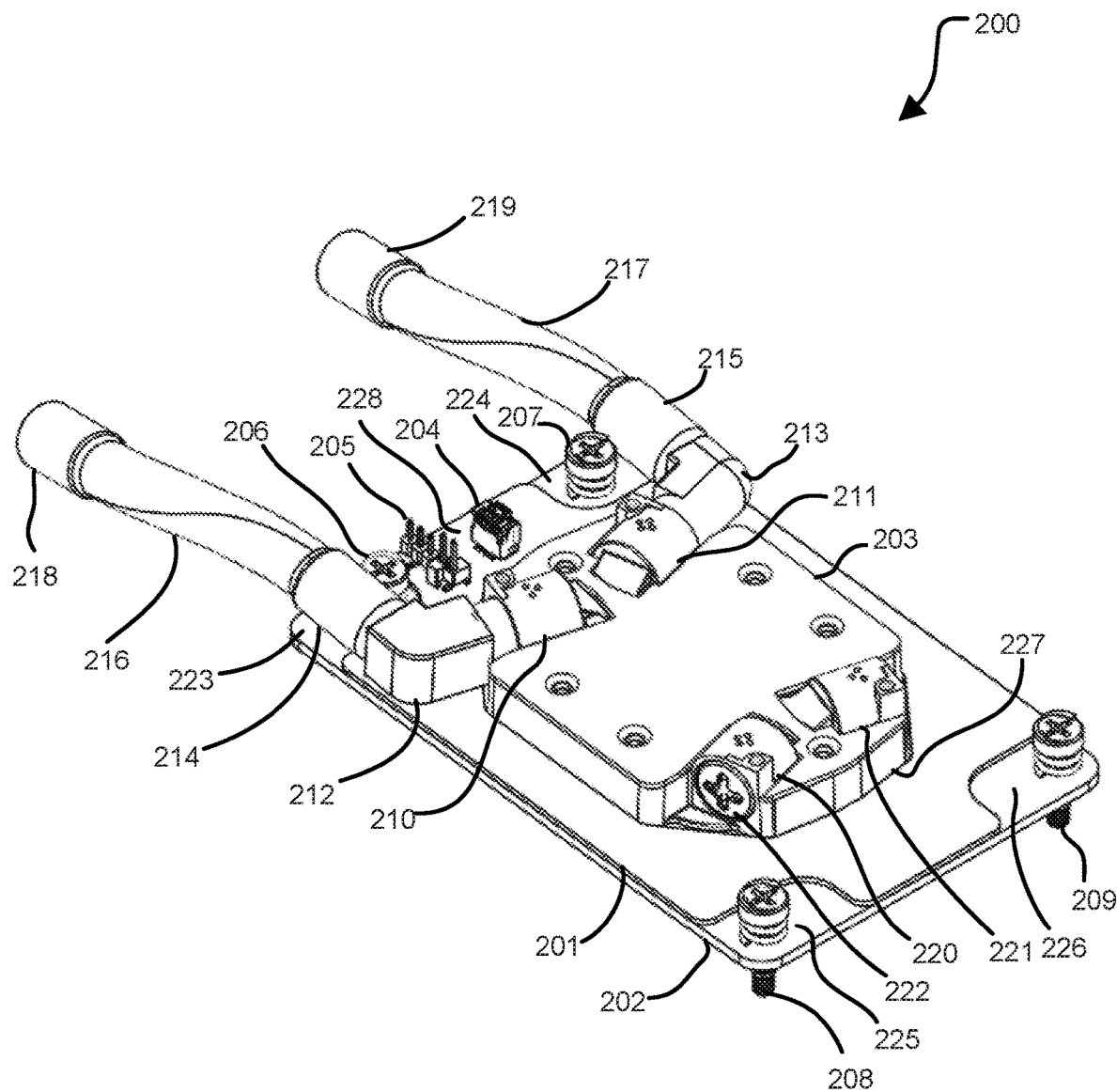
FIG. 2 is a perspective view of a liquid cooling subsystem for an information handling system, the liquid cooling subsystem including a digital leak detection apparatus according to an embodiment of the present disclosure.

FIG. 2 is a perspective view diagram illustrating a liquid cooling subsystem for an information handling system, the liquid cooling subsystem comprising a digital leak detection apparatus according to an embodiment of the present disclosure. Liquid cooling subsystem 200 comprises a digital leak detection apparatus situated on circuit board 201, a base plate 202, a heat exchanger 203, electronic device 204, electrical connector 205, mounting screw 206, mounting screw 207, mounting screw 208, mounting screw 209, coolant fitting 210, coolant fitting 211, coolant elbow 212, coolant elbow 213, coolant fitting 214, coolant fitting 215, coolant tube 216, coolant tube 217, coolant fitting 218, coolant fitting 219, coolant fitting 220, coolant fitting 221, and coolant plug 222. The corners of circuit board 201, which may have an otherwise rectangular outer perimeter, may be relieved, for example with substantially rectangular reliefs, to give circuit board 201 more of plus-sign-shaped ("+") outer perimeter. The corner reliefs may allow portions 223, 224, 225, and 226 of base plate 202 to be exposed. Circuit board 201 defines an opening 227 through its central portion through which heat exchanger 203 may extend. Electronic circuitry, such as electronic device 204 and electrical connector 205 are located on a portion 228 of circuit board 201.

A liquid path through liquid cooling subsystem 200 extends from coolant fitting 208, through coolant tube 216, through coolant fitting 214, through coolant elbow 212, through coolant fitting 210, through heat exchanger 203, through coolant fitting 211, through coolant elbow 213, through coolant fitting 215, through coolant tube 217, and through coolant fitting 219. Coolant fittings 220 and 221 may be plugged, such as with coolant plug 222, shown plugging coolant fitting 220, or the plugs may be removed and coolant fittings, elbows, and tubes may be connected to coolant fittings 220 and 221. Mounting screws 206, 207, 208, and 209 may extend through holes defined in the corners of base plate 202, for example, through corner reliefs defined around the perimeter of circuit board 201.

The axes of mounting screws 206, 207, 208, and 209 may be perpendicular to the plane of base plate 202. Circuit board 201 may be in a plane parallel to the plane of base plate 202. The plane of circuit board 201 may be adjacent above the plane of base plate 202. Circuit board 201 may be attached to base plate 202, for example, using an adhesive. Coolant plumbing components, such as coolant elbows 212 and 213 and coolant fittings 214 and 215 may overlie portions of circuit board 201 and base plate 202.

Figure 3:
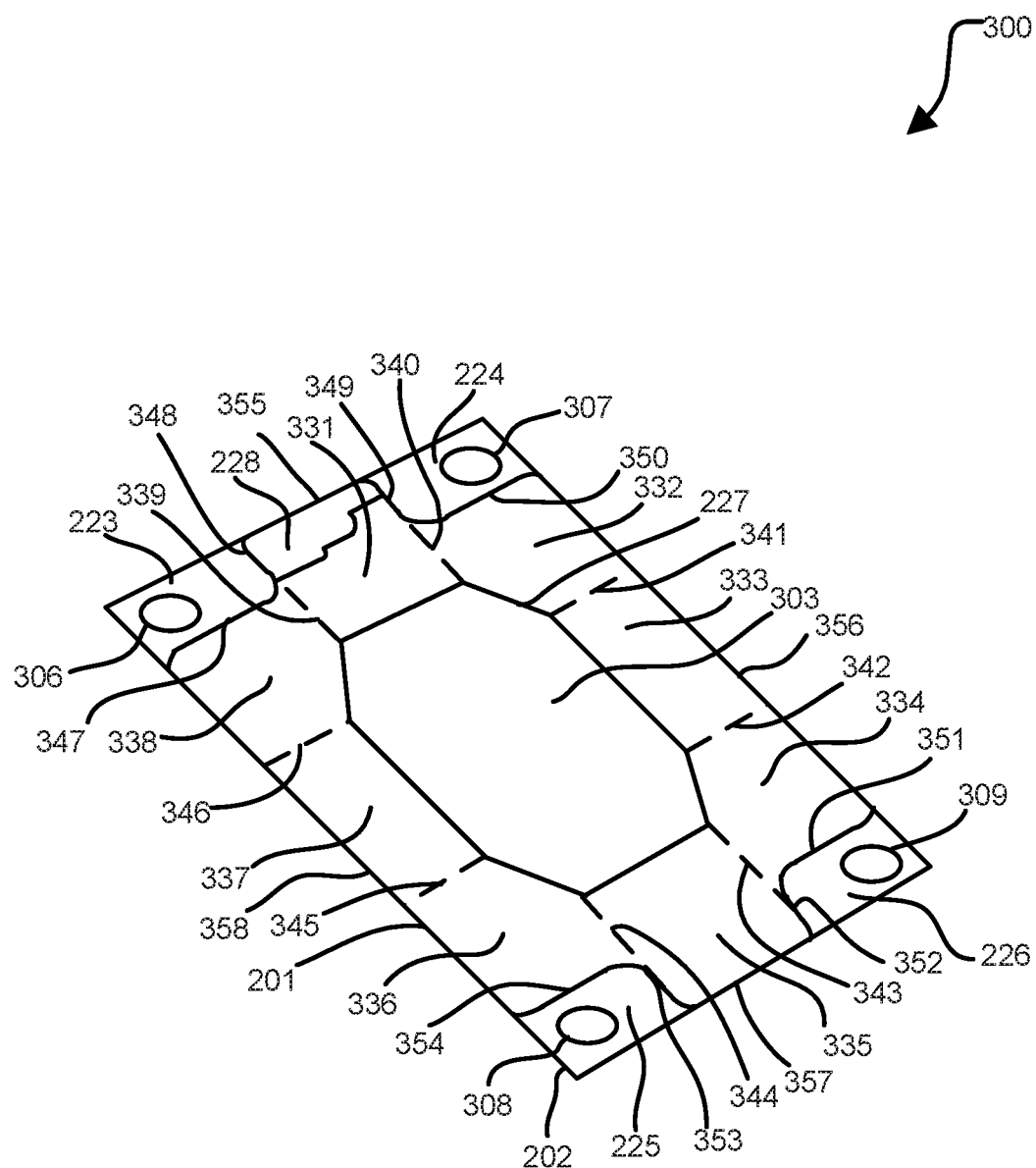
FIG. 3 is a perspective view of a digital leak detection apparatus according to an embodiment of the present disclosure.

FIG. 3 is a perspective view diagram illustrating a digital leak detection apparatus according to an embodiment of the present disclosure. Digital leak detection apparatus 300 is fabricated on circuit board 201. For clarity, circuit board 201 is shown on base plate 202 in absence of the other elements shown in FIG. 2. Holes 306, 307, 308, and 309, defined in the corners of base plate 202, through which mounting screws 206, 207, 208, and 209 passed in FIG. 2, can be seen in FIG. 3. Portions 223, 224, 225, and 226 of base plate 202 can be seen through the corner reliefs defined around the perimeter of circuit board 201. The corner reliefs may be created for circuit board 201, for example, by using a routing tool to cut edges 347, 348, 349, 350, 351, 352, 353, and 354 of circuit board 201. Edges 355, 356, 357, and 358 of circuit board 201, which may align with edges of base plate 202, span lengths between the corner reliefs. Opening 227 defined in circuit board 201 is fully visible in FIG. 3. Opening 227 may also be defined in base plate 202. The hole 303 defined by opening 227 is visible in FIG. 3. Portion 228 of circuit board 201, in which electric components may be situated, may be set apart from portions of circuit board 201 in which sensing trace regions may be defined. For example, sensing trace regions 331, 332, 333, 334, 335, 336, 337, and 338 may be defined on an upper surface of circuit board 201. Boundary 339 is defined between sensing trace regions 338 and 331. Boundary 340 is defined between sensing trace regions 331 and 332. Boundary 341 is defined between sensing trace regions 332 and 333. Boundary 342 is defined between sensing trace regions 333 and 334. Boundary 343 is defined between sensing trace regions 334 and 335. Boundary 344 is defined between sensing trace regions 335 and 336. Boundary 345 is defined between sensing trace regions 336 and 337. Boundary 346 is defined between sensing trace regions 337 and 338.

Figure 4:
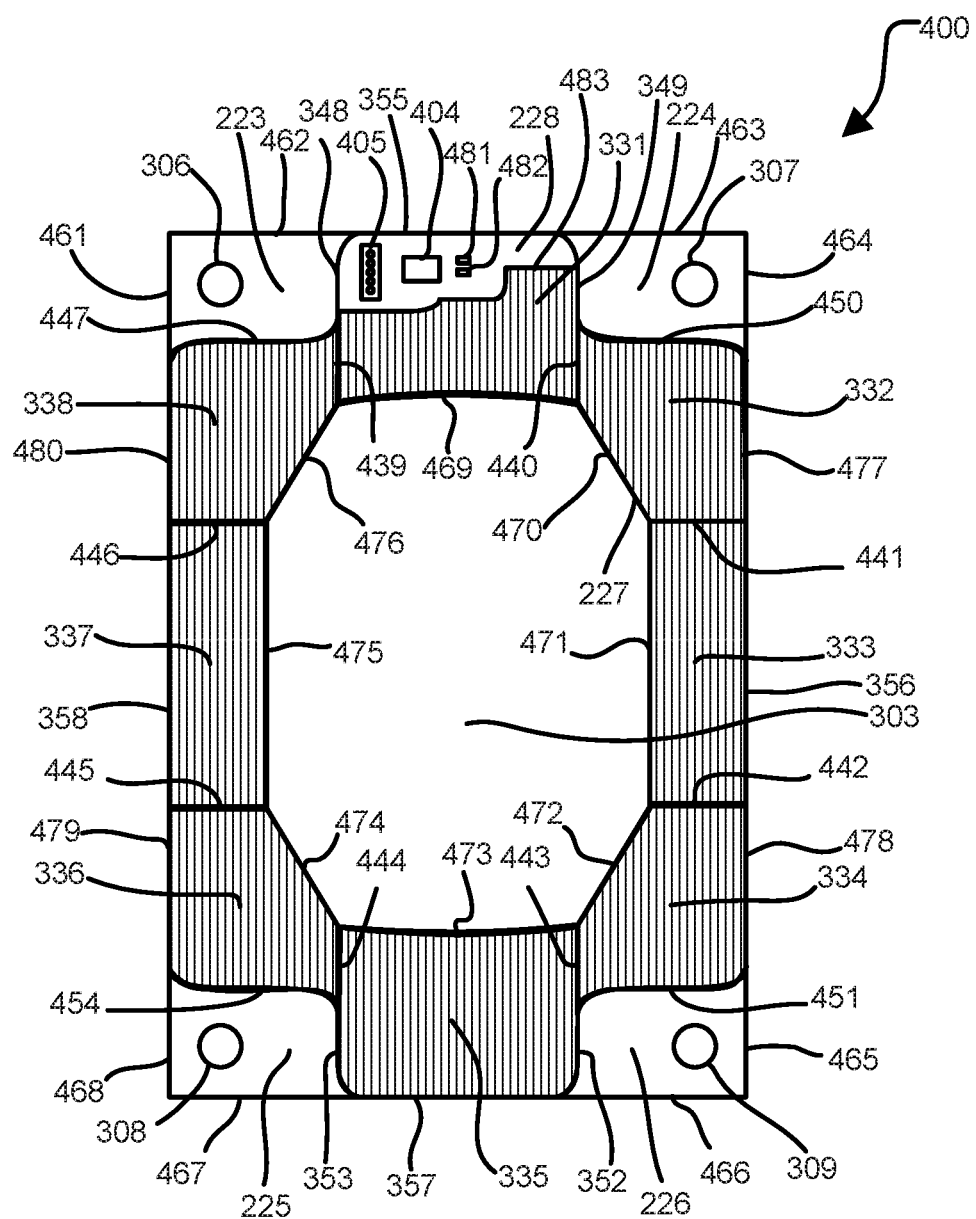
FIG. 4 is a plan view of a digital leak detection apparatus according to an embodiment of the present disclosure.

FIG. 4 is a plan view diagram illustrating a digital leak detection apparatus according to an embodiment of the present disclosure. Digital leak detection apparatus 400 is fabricated on circuit board 201. An upper surface of circuit board 201 is visible. Portions 223, 224, 225, and 226 of base plate 202 are visible through the corner reliefs of circuit board 201. Holes 306, 307, 308, and 309 defined in base plate 202 are visible in portions 223, 224, 225, and 226, respectively, of base plate 202. Edges 348, 349, 352, and 353 of the corner reliefs of circuit board 201 are shown. Edge 355 of circuit board 201 is shown aligned with edge 462 of portion 223 of base plate 202 and with edge 463 of portion 224 of base plate 202. Edge 356 of circuit board 201 is shown aligned with edge 464 of portion 224 of base plate 202 and with edge 465 of portion 226 of base plate 202. Edge 357 of circuit board 201 is shown aligned with edge 466 of portion 226 of base plate 202 and with edge 467 of portion 225 of base plate 202. Edge 358 of circuit board 201 is shown aligned with edge 468 of portion 225 of base plate 202 and with edge 461 of portion 223 of base plate 202. Opening 227 defined in circuit board 201 is shown as being defined by edges along which barriers 469, 471, 473, and 475 lie, as well as along edges 470, 472, 474, and 476, along which barriers may or may not be provided. The hole 303 defined by opening 227 is visible in FIG. 4. Barrier 447 lies along edge 347. Barrier 450 lies along edge 350. Barrier 451 lies along edge 351. Barrier 454 lies along edge 354. Barrier 439 lies along boundary 339. Barrier 440 lies along boundary 340. Barrier 441 lies along boundary 341. Barrier 442 lies along boundary 342. Barrier 443 lies along boundary 343. Barrier 444 lies along boundary 344. Boundary 445 lies along boundary 345. Boundary 446 lies along boundary 346. Barriers 447 and 478 lie along edge 356. Barriers 479 and 480 lie along edge 358. Barriers 439, 469, 440, 450, 477, 441, 471, 442, 451, 443, 473, 444, 454, 479, 445, 475, 446, 480, and 447 are connected in series to form a contiguous barrier separating sensing trace regions 331, 332, 333, 334, 335, 336, 337, and 338 from one another.

Portion 228 of circuit board 201 is shown with pads 404, 481, and 482 upon which electrical components may be soldered and pads 405 upon which connector 205 may be soldered. A boundary 483 is defined between portion 228 of circuit board 201 and sensing trace region 331 of circuit board 201.

Figure 5:
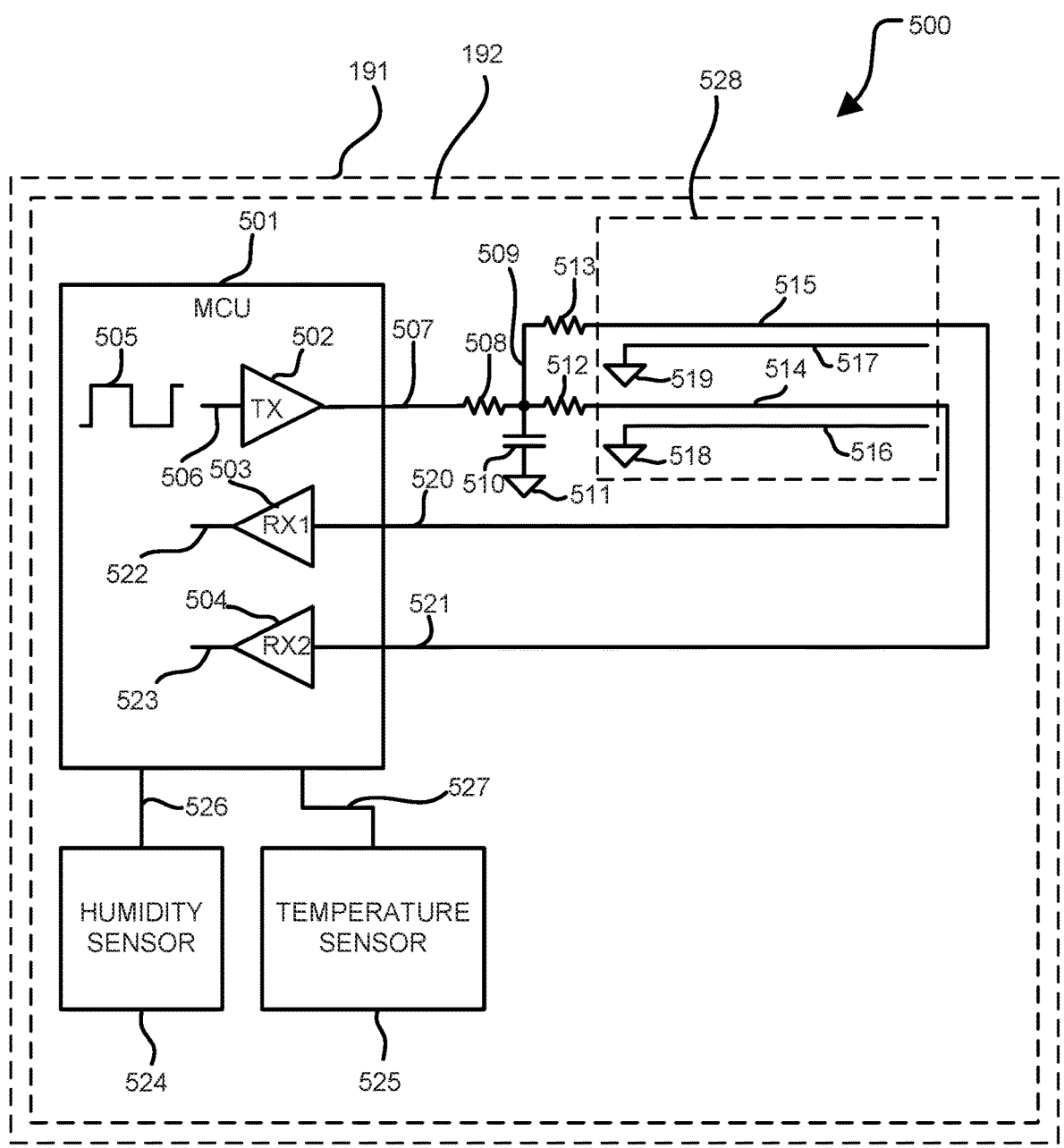
FIG. 5 is a schematic diagram illustrating a digital leak detection apparatus according to an embodiment of the present disclosure.

FIG. 5 is a schematic diagram illustrating a digital leak detection apparatus according to an embodiment of the present disclosure. Circuitry 500 is shown within digital leak detection apparatus 192, which is shown within liquid cooling subsystem 191. Circuitry 500 comprises a processor, such a microcontroller unit (MCU) 501, resistor 508, capacitor 510, impedance devices 512 and 513, sensing traces 514 and 515, reference sensing traces 516 and 517, humidity sensor 524, and temperature sensor 525. MCU 501 comprises transmitter 502, first receiver 503, and second receiver 504. A waveform 505 is provided at transmitter input 506 of transmitter 502. Transmitter 502 provides transmitter output 507 to a first terminal of resistor 508. A second terminal of resistor 508 is connected, at node 509, to a first terminal of capacitor 510, to a first terminal of impedance device 512, and to a first terminal of impedance device 513. A second terminal of capacitor 510 is connected to reference potential 511. Impedance devices 512 and 513 may, for example, be resistors or may, for example, be other devices providing impedance.

Microstrip differential trace moisture sensor 528 comprises sensing traces 514 and 515 and reference sensing traces 516 and 517. A second terminal of impedance device 512 is connected to a first end of sensing trace 514. A second terminal of impedance device 513 is connected to a first end of sensing trace 515. Sensing trace 514 is configured to lie parallel within the plane of the upper surface of circuit board 201 to reference sensing trace 516. Such parallelism may be obtained, for example, by multiple parallel segments of sensing trace 514 and reference sensing trace 516. A first end of reference sensing trace is connected to reference potential 518. Sensing trace 515 is configured to lie parallel within the plane of the upper surface of circuit board 201 to reference sensing trace 517. Such parallelism may be obtained, for example, by multiple parallel segments of sensing trace 515 and reference sensing trace 517. A first end of reference sensing trace is connected to reference potential 519. A second end of sensing trace 514 is connected to receiver input 520 of receiver 503. Receiver 503 provides receiver output 522. A second end of sensing trace 515 is connected to receiver input 521 of receiver 504. Receiver 504 provides receiver output 523. MCU 501 may be connected to one or more of humidity sensor 524 via humidity input 526 and temperature sensor 525 via temperature input 527.

The drive impedance at which the transmitter (and low-pass filter) drive the moisture sensor can be selected to optimize signal strength and discrimination between a high humidity level and a leak. The spacing of the differential traces can be selected to optimize signal strength and discrimination between a high humidity level and a leak. In accordance with at least one embodiment, an additional receiver can be provided to receive a receiver input from a twisted leak detect cable, which can be used, for example, to cover remote areas of the information handling system (IHS) chassis.

In accordance with at least one embodiment, the sensor impedance is dependent on water content (including humidity), frequency, and temperature. Sensor response when driven with a direct-current (DC) signal can make discrimination of a signal obtained from a coolant leak vs. a signal obtained from high humidity difficult. In accordance with at least one embodiment, superior performance is provided by using an alternating-current (AC) signal to drive the sensors. As an example, using an AC waveform to drive the moisture sensors, sensor response under American Society of Heating, Refrigerating, and Air-Conditioning Engineers (ASHRAE) A4 specifications with 70% relative humidity (RH) at 35 degrees Celsius provides attenuation associated with a leak that is significantly larger than that associated with the humidity alone, and a leak can be easily detected. In accordance with at least one embodiment, even at 35 degrees Celsius and 90% RH, such a high level of humidity can be differentiated from a leak event with a measurement difference of at least three decibels (dB).

In accordance with at least one embodiment, the transmitter drives both sensors with the same signal and measures them with the receivers simultaneously. In accordance with at least one embodiment, the geometry and length of the sensor traces are matched, so the measured signals will be similar, independent of humidity and temperature, unless there is a leak. In case of a leak, the sensors provide unbalanced output signals and the processor will detect the difference in the amplitudes.

In the unlikely case where a large leak hits both sensors at the exact same time and covers the same amount of trace length, the readings would remain similar. To cover this corner case, the processor will also look at the trend of the absolute values as well, not just relative values between sensors. Slow changes (e.g., those occurring over seconds) indicate humidity variations in the environment. Fast declines of both signal amplitudes indicate a large leak that covers both sensors. Optional humidity and temperature sensors are available on-board as tie-breaker. The output of this the humidity and temperature sensors can also be used to implement a black box feature, recording a history of humidity in the system.

Figure 6:
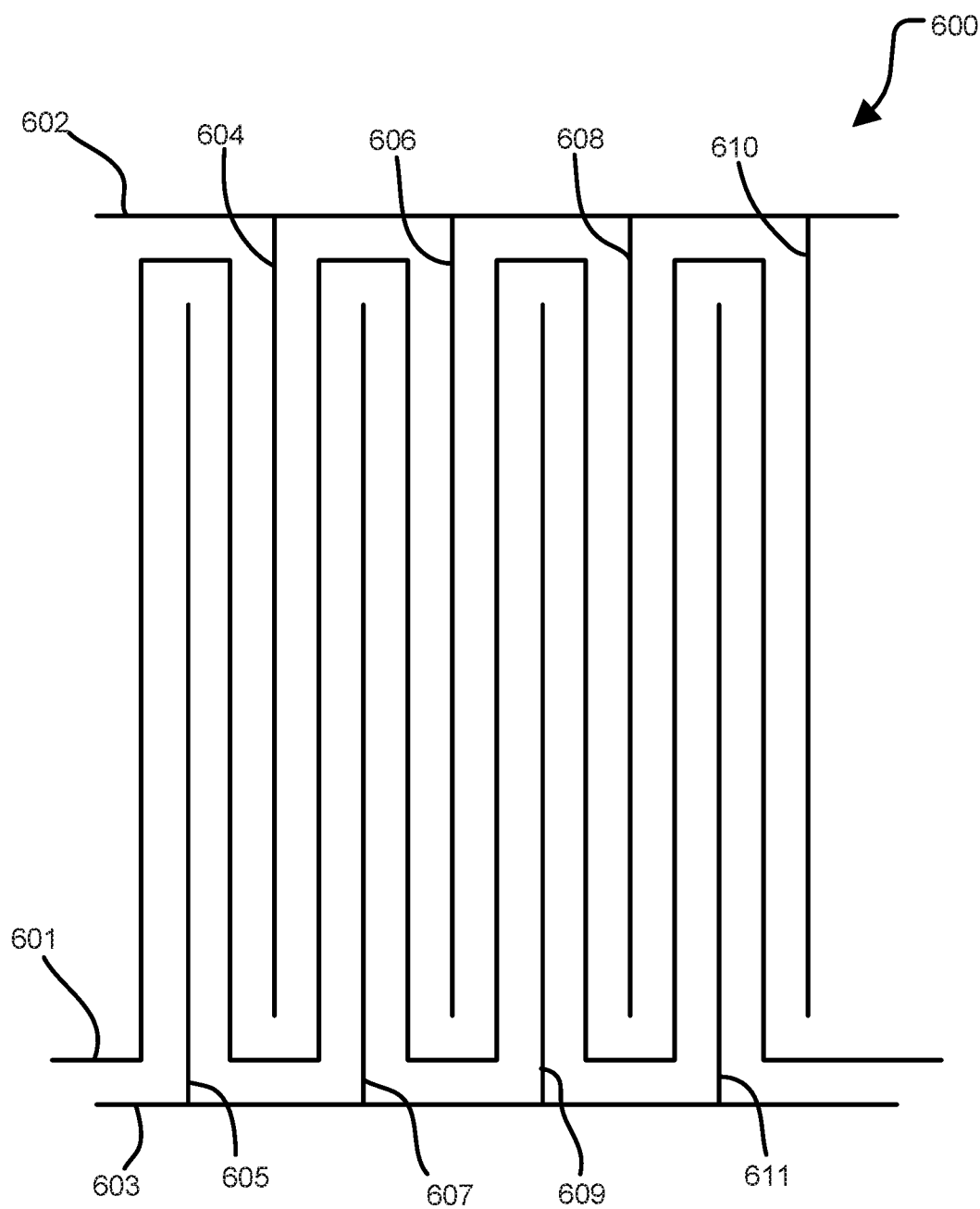
FIG. 6 is a block diagram illustrating a microstrip differential trace moisture sensor for a digital leak detection apparatus according to an embodiment of the present disclosure.

FIG. 6 is a block diagram illustrating a microstrip differential trace moisture sensor for a digital leak detection apparatus according to an embodiment of the present disclosure. Microstrip differential trace moisture sensor 600 provides interdigitated reference sensing traces through which sensing trace 601 meanders. First common reference potential interconnect 602 is connected to reference sensing traces 604, 606, 608, and 610. Second common reference potential interconnect 603 is connected to reference sensing traces 605, 607, 609, and 611. Reference sensing traces 604, 606, 608, and 610 serve as a first set of digitated reference sensing traces. Reference sensing traces 605, 607, 609, and 611 serve as a second set of digitated reference sensing traces disposed so as to interdigitate in opposition to the first set of digitated reference sensing traces. Sensing trace 601 follows a meandering path between the first and second sets of digitated reference sensing traces. The path of sensing trace 601 may be equidistant from the first and second sets of digitated reference sensing traces. Sensing trace 601, reference sensing traces 604, 605, 606, 607, 608, 609, 610, and 611, and common reference potential interconnects 602 and 603 may be instantiated on the upper surface of circuit board 201 as metallic traces, such as copper traces. The metallic traces may be plated, for example, gold plated.

Figure 7:
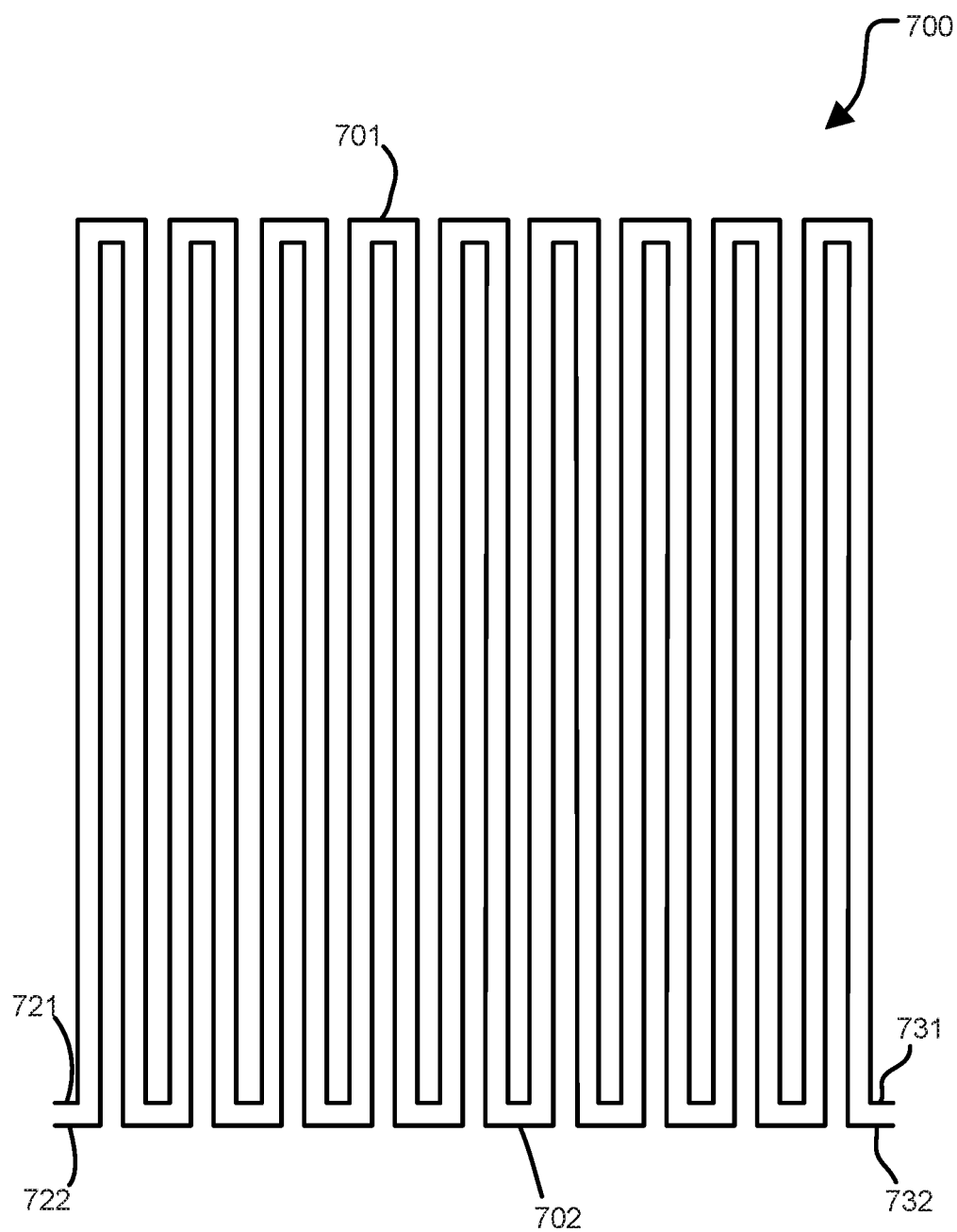
FIG. 7 is a block diagram illustrating microstrip differential trace moisture sensor for a digital leak detection apparatus according to an embodiment of the present disclosure.

FIG. 7 is a block diagram illustrating microstrip differential trace moisture sensor for a digital leak detection apparatus according to an embodiment of the present disclosure. Microstrip differential trace moisture sensor 700 provides a meandering reference sensing trace 702, which lies parallel in the plane of the upper surface of circuit board 201 to the meandering sensing trace 701. Sensing trace 701 follows its meandering path from a first end 721 to a second end 731. Reference sensing trace 702 follows its meandering path from a first end 722 to a second end 732. Reference sensing trace 702 is interposed with sensing trace 701. Sensing trace 701 and reference sensing trace 702 follow parallel meandering paths. The path of sensing trace 701 may be equidistant from the path of reference sensing trace 702. Sensing trace 701 and reference sensing trace 702 may be instantiated on the upper surface of circuit board 201 as metallic traces, such as copper traces. The metallic traces may be plated, for example, gold plated.

Figure 8:
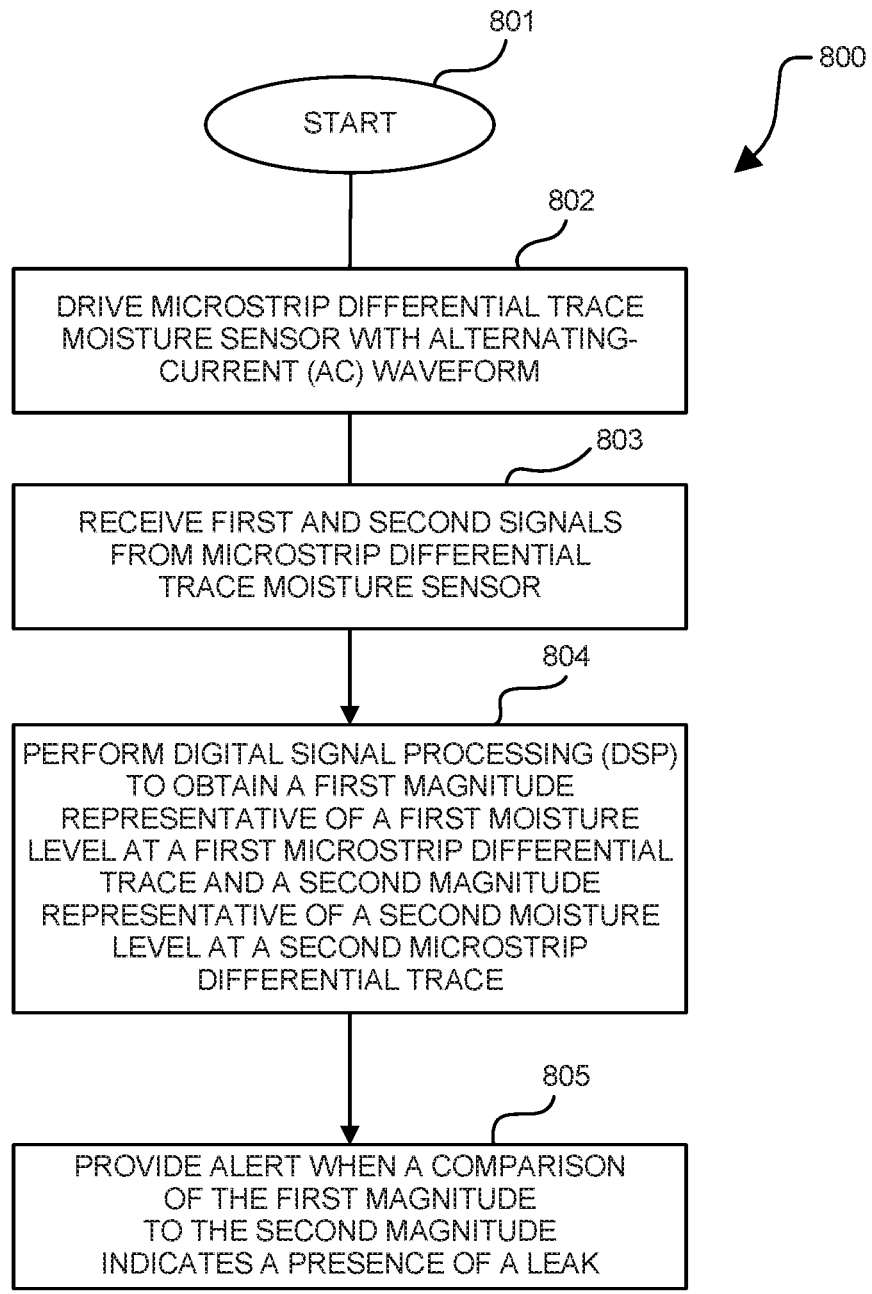
FIG. 8 is a flow diagram illustrating a method for digital leak detection according to an embodiment of the present disclosure.

FIG. 8 is a flow diagram illustrating a method for digital leak detection according to an embodiment of the present disclosure. Method 800 begins at block 801 and continues to block 802. At block 802, a transmitter drives a microstrip differential trace moisture sensor with an AC waveform. As an example, the transmitter may drive the microstrip differential trace moisture sensing element with a square wave AC waveform. The square wave AC waveform may be modified, for example, using a low-pass filter. As an alternative, the differential trace moisture sensing element may be driven with an AC waveform of a different shape, such as a sine wave. As an example, the transmitter can drive both a first and a second microstrip differential trace moisture sensor.

From block 802, method 800 continues to block 803. At block 803, a first signal is received at a first receiver from a first microstrip differential trace moisture sensor and a second signal is received at a second receiver from a second microstrip differential trace moisture sensor. As one example, the first receiver and the second receiver may be separate receivers. As another example, the first and second receivers may be implemented by using a multiplexer to direct the respective signals to a common receiver.

From block 803, method 800 continues to block 804. At block 804, a processor performs digital signal processing (DSP) to obtain a first magnitude representative of a first moisture level at a first microstrip differential trace and a second magnitude representative of a second moisture level at a second microstrip differential trace. From block 804, method 800 continues to block 805. At block 805, the digital leak detection apparatus provides an alert when the comparison of the first magnitude to the second magnitude indicates the presence of a leak.

Figure 9:
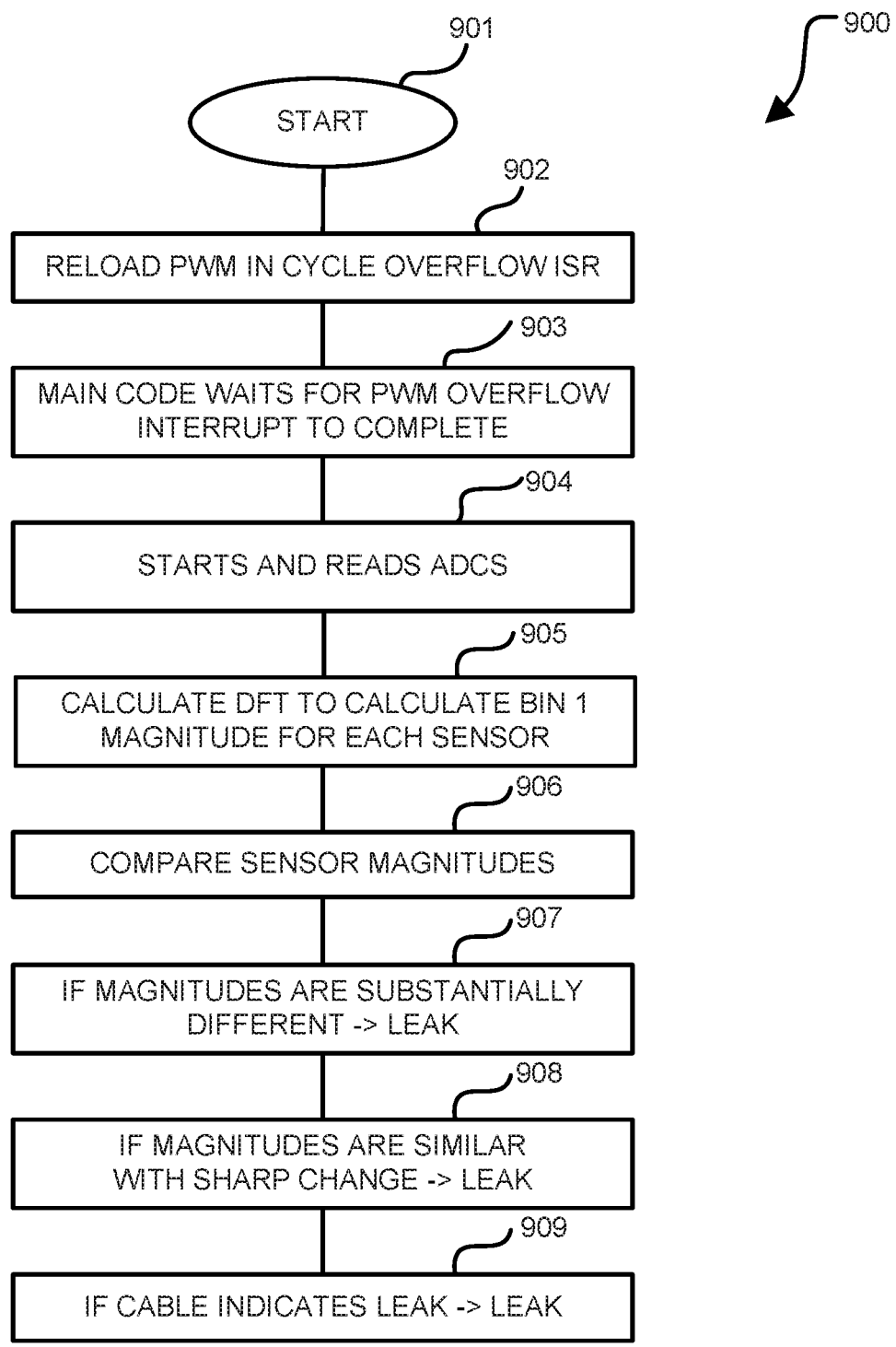
FIG. 9 is a flow diagram illustrating a method digital signal processing (DSP) for digital leak detection according to an embodiment of the present disclosure.

FIG. 9 is a flow diagram illustrating a method digital signal processing (DSP) for digital leak detection according to an embodiment of the present disclosure. Method 900 begins at block 901 and continues to block 902. At block 902, a pulse width modulation (PWM) value is loaded (and reloaded in subsequent instances) in a cycle overflow interrupt service routine (ISR) in a processor. From block 902, method 900 continues to block 903. At block 903, the processor waits for a PWM overflow interrupt to be completed. From block 903, method 900 continues to block 904.

At block 904, the processor starts data conversions in analog-to-digital converters (ADCs) and reads the results of the data conversions. As an example, separate ADCs may be used. As another example, a multiplexer may be used to select a common ADC for both conversions. From block 904, method 900 continues to block 905. At block 905, a discrete Fourier transform (DFT) is calculated to obtain a bin-1 magnitude for each moisture sensor. Bin-1 refers to a first bin of the discrete Fourier transform results. An implementation using only Bin-1 shows the practicality of using a single-bin DFT, which can simplify processing in the processor. From block 905, method 900 continues to block 906.

At block 906, the processor compares sensor magnitudes of the different moisture sensors. From block 906, method 900 continues to block 907. At block 907, when the magnitudes are found to have substantially different values from one another, a leak is detected, and a corresponding alert can be issued. At block 908, when the magnitudes are found to be similar but are found to have recently undergone an abrupt change showing increased moisture, a leak is detected, and a corresponding alert can be issued. From block 908, method 900 continues to block 909. At block 909, an additional moisture sensor, such as a moisture sensing cable can be used in conjunction with the moisture sensors of circuit board 201. When the additional moisture sensor indicates an increase in moisture, either slowly or rapidly relative to the magnitudes of the moisture sensors of circuit board 201 or rapidly in conjunction with similar rapid changes of any of the moisture sensors of circuit board 201, a leak is detected, and a corresponding alert can be issued.

In accordance with at least one embodiment, the sensor would be driven by a pure sine wave and read back by a narrow band peak detector. However, hardware cost and complexity can be reduced using a different approach. In accordance with at least one embodiment, a low-pass filter is provided to allow an easily generated square wave to approximate a sine wave, and digital signal processing (DSP) is used in a processor receiving signals from the receivers to improve sensitivity, selectivity, and reliability on the receive side. Using DSP, the processor can calculate a DFT to find the amplitude for a relevant portion of the AC spectrum. However, a traditional DFT approach would be computationally intensive, and an inexpensive 8-bit MCU is typically not equipped to execute the trigonometric functions and wide multiply/add instructions of a traditional DFT approach at the desired rate. Such a processor typically doesn't have enough memory for sufficiently large lookup tables or enough computational power for real-time calculations of a DFT. Several techniques are used to eliminate time-consuming operations and work around the limited resources of the MCU.

In accordance with at least one embodiment, one performance improvement involves avoiding the use of sine and cosine calculations. The MCU generates a triangle wave (instead of a sine wave) to drive the sensors using the PWM hardware (HW) module. The triangle is trivial to generate and it is substantially similar to the sine, with harmonics rolling off at a $1/k^2$ rate. The low-pass response of the sensor will attenuate the harmonics further.

In accordance with at least one embodiment, another performance improvement involves avoiding windowing. The PWM engine generates an interrupt after each output sample. The ISR reads the ADCs, updates the next PWM value, restarts the ADCs, and calculates the DFT for both sensors for a full triangle period. Since the DFT is always executed on one full period, there is no need for windowing and that reduces multiplications.

In accordance with at least one embodiment, another performance improvement is to only calculate bin 1 of the DFT. Due to the full period processing, the 1st frequency bin of the DFT is the sensor response to the fundamental frequency of the triangle, so there is no need to calculate the other bins of the DFT.

In accordance with at least one embodiment, another performance improvement is to use square waves. The 1st bin DFT calculation is defined as: X(1)=sum(x(n)*[cos (n*2*pi/M)−j*sin(n*2*pi/M)]), where n={0 . . . M−1} and x(n) are the ADC samples, and M is the number of samples per triangle period. By replacing sine and cosine waves with a square wave, the MCU can execute an add/subtract instead of a multiply/add, and, since the sine and cosine waveform is replaced by a series of +1/−1 values, the multiplication is simplified to: X(1)=sum[x(n)*(+/−1+/−j)], where the sign depends on n.

In accordance with at least one embodiment, another performance improvement is to use integers. Simulations show no accuracy issues when truncating to 2-3 digits. Also, the square root and the ratio do not have to be calculated, as the magnitude squares can be directly compared to detect leaks.

In accordance with at least one embodiment, with these optimizations, the MCU is able to process a pair of sensor in 18 µs. This is >25× faster than a traditional DFT on this MCU and allows real time processing of 800 samples per period, as an example.

Replacing the sine and cosine waveforms with square waves in the DFT calculations has two side effects. First, the bin magnitudes are larger by a factor of 4/pi, which is not a problem. Second, the bins not only contain their desired values, but also some error from the fact that the square has harmonics that will interact with noise in the input signal. However, not being as selective as traditional DFT is acceptable with careful sensor frequency selection, so the second side effect is also not problematic.

Because the moisture sensor traces are not shielded, they can pick up environmental electrical noise. For example, for a desired signal that is a 15 Hz sine wave that swings from 3.3V to ground, a large (e.g., 2 Vpp) 60 Hz power-grid noise can ride on top of the desired signal, along with some wide-band noise. Nonetheless, the square DFT spreads the random noise across all bins so it doesn't have a strong impact on bin 1 even when integer math is used.

In accordance with at least one embodiment, a frequency of 14.953 Hz was chosen to drive the moisture sensors. As one criterion, the triangle frequency was selected to be in the 10-100 Hz range, where the sensor provides a strong signal. Higher frequencies are attenuated more, and the ADC would be sampling closer to the noise floor in high humidity environments. Lower frequencies don't are limited in their ability to provide enough margin to distinguish between humidity and a leak. Using a frequency of 14.953 Hz (or near that frequency) can, for example, provide a ~10 dB difference between ASHRAE A4 humidity and a leak, which makes the leak easily detectable. The MCU can process a large enough number of samples per period at a frequency of around 14.953 Hz in order to spread noise and provide a high-confidence decision. The frequency is selected to be generated by using a sample count that is divisible by 4 to ensure symmetrical square waveform in software. A choice of 800 samples leads to 14.953 Hz. Since a square wave doesn't have even harmonics, the calculations will suppress noise at even harmonics of 14.953 Hz, such as 60 Hz and 120 Hz (noise on the power grid). Ideally, both even and odd harmonics of 50 and 60 Hz would fall into those bins. That means the triangle output frequency would ideally be 12.5 Hz for 50-Hz (=50/4) electrical systems, as in Europe, and 15 Hz (=60/4) for 60-Hz electrical systems, as in North America.

A benefit of choosing an even harmonic relationship is that the 1st bin is not affected by power noise. Given an impracticality of finding a single frequency that perfectly avoids all harmonics of both 50 and 60 Hz power grid, a compromise is to use a frequency that works well for lower harmonics and that relies on the sensor to filter out higher harmonics. Alternatively, two different PWM frequencies could be made available, each optimized for the frequency of one power grid. A second frequency of 12.513 Hz at 956 samples could be provided for 50-Hz electrical systems. On startup, the MCU output could drive the sensor with a fixed amplitude (DC voltage) and measure the sensor over a full period. If bin 1 magnitude is not near 0, then the MCU could switch over to the other frequency. This calibration could also be done when a leak is detected to double check the noise floor before alerting the system.

In accordance with at least one embodiment, the MCU can also implement a black box feature (saving parameter values in temporal proximity to an event, such as the detection of a coolant leak) by keeping the measurements results from a few most recent sensor samples and the humidity sensor before a leak occurred. Once the leak occurs, these samples are stored to flash and accessible to a baseboard management controller (BMC), which can be accessed to manage operation of the IHS. This can be useful for debugging or for determining system noise, humidity, etc.

The DFT is based on the trigonometric fact that the integral over 2pi of sin(at)*sin(bt)=0 unless a=b, where a and b are integers. A square DFT replaces sin(at) with square(at) and sin(bt) with square(bt). A square DFT is particularly useful in at least one embodiment described herein since the input signal is locked to the sample rate, and the input signal frequency can be chosen to avoid the odd harmonic leakage (by making sure the power grid is not an odd harmonic of the triangle). With a pure sine wave input, both the classic and square DFT would provide the same result for bin 1. When the input is a sine wave mixed with even-harmonically related noise, both the classic and square DFT provide the same result. When the input is a sine wave mixed with an unrelated sine wave, neither DFT can separate the bins without windowing. Some of the noise will leak into bin 1. When the input is a sine wave mixed with an odd-harmonically related sine wave, the square DFT cannot separate the bins. In this example, the input noise (which happens to be at the 5th harmonic of the input sine wave) will be lumped into bin 1 and can cause a 2% error. However, by choosing the sensor frequency carefully, it is possible to avoid having 50 Hz or 60 Hz power noise distort the readings. With the proposed frequencies, wideband noise will spread across all bins. The high sample rate and sample count per period ensures that the noise impact to bin 1 is negligible.

Sin Approximation with Triangle

The harmonic content of a triangle wave is small but manageable even though it exceeds the complete absence of harmonic content of a pure sine wave. For a sine wave and a triangle wave of equal amplitude at the fundamental frequency, the sine wave has no harmonics, and the triangle wave has diminishing odd harmonics, with amplitude $1/k^2$ where k is the harmonic number. The hardware acts as a low pass filter, and the DFT also suppresses harmonics. Therefore, the error caused by driving the sensor with triangle instead of sine is insignificant, as the hardware filtering and DFT harmonic suppression attenuate the already small odd harmonic content.

In accordance with one embodiment, a sensor amplitude drop occurs immediately when a drop of water lands on the moisture sensor, but it takes ~100 ms for the liquid to spread to cover a large enough area of the sensor to cross the detect threshold. Thus, very rapid and reliable detection of a coolant leak can be provided using an inexpensive solution.

In accordance with one embodiment, an apparatus comprises a transmitter circuit configured to provide a transmitted waveform at a transmitter output, a first microstrip differential trace extending from a first microstrip differential trace first end to a first microstrip differential trace second end, a first resistor having a first resistor first end coupled to the transmitter output and a first resistor second end coupled to the first microstrip differential trace first end, a second microstrip differential trace extending from a second microstrip differential trace first end to a second microstrip differential trace second end, a second resistor having a second resistor first end coupled to the transmitter output and a second resistor second end coupled to the second microstrip differential trace first end, a first receiver circuit having a first receiver circuit input coupled to the first microstrip differential trace second end, the first receiver configured to provide a first received signal, a second receiver circuit having a second receiver circuit input coupled to the second microstrip differential trace second end, the second receiver configured to provide a second received signal, and a processor configured to receive the first received signal and the second received signal and to perform digital signal processing on the first received signal and the second received signal, to detect a coolant leak, and to provide an alert upon detection of the coolant leak. In accordance with one embodiment, the apparatus further comprises a low-pass filter having a low-pass filter input and a low-pass filter output, the transmitter output coupled to the low-pass filter input, the low-pass filter output coupled to the first resistor first end and to the second resistor first end.

In accordance with one embodiment, the first microstrip differential trace and the second microstrip differential trace are disposed on a coplanar surface of a circuit board. In accordance with one embodiment, the circuit board defines an aperture configured for the acceptance of a heat exchanger therein. In accordance with one embodiment, the first microstrip differential trace and the second microstrip differential trace are disposed over a plurality of regions of the circuit board, wherein a raised barrier selected from a group consisting of solder mask material and silk screen material separates a first region of the plurality of regions from a second region of the plurality of regions. In accordance with one embodiment, the transmitted waveform is periodic at a frequency of between 0.1 Hertz and 10 kiloHertz. In accordance with one embodiment, the transmitted waveform is periodic at a frequency of between 1 Hertz and 1000 Hertz. In accordance with one embodiment, the transmitted waveform is periodic at a frequency between 10 Hertz and 100 Hertz.

In accordance with one embodiment, a method comprises driving a first microstrip differential trace with an alternating-current (AC) waveform, providing a first received signal obtained from the first microstrip differential trace, driving a second microstrip differential trace with the alternating-current (AC) waveform, providing a second received signal obtained from the second microstrip differential trace, performing digital signal processing (DSP) to obtain a first magnitude representative of a first moisture level at the first microstrip differential trace and a second magnitude representative of a second moisture level at the second microstrip differential trace, and providing an alert when a comparison of the first magnitude and the second magnitude indicate a presence of a coolant leak. In accordance with one embodiment, the performing the DSP further comprises calculating a discrete Fourier transform (DFT) to obtain the first magnitude for the first microstrip differential trace and the second magnitude for the second microstrip differential trace. In accordance with one embodiment, the providing the alert when the comparison of the first magnitude and the second magnitude indicate the presence of the coolant leak comprises providing the alert when the first magnitude and the second magnitude are substantially different.

In accordance with one embodiment, the providing the alert when the comparison of the first magnitude and the second magnitude indicate the presence of the coolant leak comprises providing the alert when the first magnitude and the second magnitude have abruptly changed from previous magnitudes. In accordance with one embodiment, the providing the alert when the comparison of the first magnitude and the second magnitude indicate the presence of the coolant leak comprises providing the alert when at least one of the first magnitude and the second magnitude has changed, respectively, from a previous first magnitude and a previous second magnitude. In accordance with one embodiment, the first magnitude is a first bin-1 magnitude and the second magnitude is a second bin-1 magnitude. In accordance with one embodiment, the method further comprises calibrating the first magnitude and the second magnitude with respect to a humidity measurement of a humidity sensor.

In accordance with one embodiment, an apparatus comprises a transmitter circuit configured to provide a transmitted waveform at a transmitter output, a first voltage divider circuit, a second voltage divider circuit, a first receiver circuit, a second receiver circuit, and a processor. The first voltage divider circuit comprises a first microstrip differential trace extending from a first microstrip differential trace first end to a first microstrip differential trace second end, and a first impedance device having a first impedance device first end coupled to the transmitter output and a first impedance device second end coupled to the first microstrip differential trace first end. The second voltage divider circuit comprises a second microstrip differential trace extending from a second microstrip differential trace first end to a second microstrip differential trace second end, and a second impedance device having a second impedance device first end coupled to the transmitter output and a second impedance device second end coupled to the second microstrip differential trace first end. The first receiver circuit has a first receiver circuit input coupled to the first microstrip differential trace second end, the first receiver configured to provide a first received signal. The second receiver circuit has a second receiver circuit input coupled to the second microstrip differential trace second end, the second receiver configured to provide a second received signal. The processor is configured to receive the first received signal and the second received signal and to perform digital signal processing on the first received signal and the second received signal, to detect a coolant leak, and to provide an alert upon detection of the coolant leak.

In accordance with one embodiment, the apparatus further comprises a low-pass filter having a low-pass filter input and a low-pass filter output, the transmitter output coupled to the low-pass filter input, the low-pass filter output coupled to the first impedance device first end and to the second impedance device first end. In accordance with one embodiment, the first microstrip differential trace and the second microstrip differential trace are disposed on a coplanar surface of a circuit board. In accordance with one embodiment, the circuit board defines an aperture configured for the acceptance of a heat exchanger therein. In accordance with one embodiment, the transmitted waveform is periodic at a frequency of between 0.1 Hertz and 10 kHz. In accordance with one embodiment, the transmitted waveform is periodic at a frequency of between 1 Hertz and 1000 Hertz. In accordance with one embodiment, the transmitted waveform is periodic at a frequency of between 10 Hertz and 100 Hertz.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims.

In the claims, means-plus-function clauses are intended to cover the structures described herein as performing the recited function and not only structural equivalents, but also equivalent structures.

What is claimed is:

1. An apparatus comprising:
   a transmitter circuit configured to provide a transmitted waveform at a transmitter output;
   a first microstrip differential trace extending from a first microstrip differential trace first end to a first microstrip differential trace second end;
   a first resistor having a first resistor first end coupled to the transmitter output and a first resistor second end coupled to the first microstrip differential trace first end;
   a second microstrip differential trace extending from a second microstrip differential trace first end to a second microstrip differential trace second end;
   a second resistor having a second resistor first end coupled to the transmitter output and a second resistor second end coupled to the second microstrip differential trace first end;
   a first receiver circuit having a first receiver circuit input coupled to the first microstrip differential trace second end, the first receiver configured to provide a first received signal;
   a second receiver circuit having a second receiver circuit input coupled to the second microstrip differential trace second end, the second receiver configured to provide a second received signal; and
   a processor configured to receive the first received signal and the second received signal and to perform digital signal processing on the first received signal and the second received signal, to detect a coolant leak, and to provide an alert upon detection of the coolant leak.

2. The apparatus of claim 1 further comprising:
   a low-pass filter having a low-pass filter input and a low-pass filter output, the transmitter output coupled to the low-pass filter input, the low-pass filter output coupled to the first resistor first end and to the second resistor first end.

3. The apparatus of claim 1, wherein the first microstrip differential trace and the second microstrip differential trace are disposed on a coplanar surface of a circuit board.

4. The apparatus of claim 1, wherein the circuit board defines an aperture configured for the acceptance of a heat exchanger therein.

5. The apparatus of claim 1, wherein the first microstrip differential trace and the second microstrip differential trace are disposed over a plurality of regions of the circuit board, wherein a raised barrier selected from a group consisting of solder mask material and silk screen material separates a first region of the plurality of regions from a second region of the plurality of regions.

6. The apparatus of claim 1, wherein the transmitted waveform is periodic at a frequency of between 0.1 Hertz and 10 kiloHertz.

7. The apparatus of claim 1, wherein the transmitted waveform is periodic at a frequency of between 1 Hertz and 1000 Hertz.

8. A method comprising:
   driving a first microstrip differential trace with an alternating-current (AC) waveform;
   providing a first received signal obtained from the first microstrip differential trace;
   driving a second microstrip differential trace with the alternating-current (AC) waveform;

providing a second received signal obtained from the second microstrip differential trace;

performing digital signal processing (DSP) to obtain a first magnitude representative of a first moisture level at the first microstrip differential trace and a second magnitude representative of a second moisture level at the second microstrip differential trace; and providing an alert when a comparison of the first magnitude and the second magnitude indicates a presence of a coolant leak.

9. The method of claim 8, wherein the performing the DSP further comprises:

calculating a discrete Fourier transform (DFT) to obtain the first magnitude for the first microstrip differential trace and the second magnitude for the second microstrip differential trace.

10. The method of claim 8, wherein the providing the alert when the comparison of the first magnitude and the second magnitude indicate the presence of the coolant leak comprises:

providing the alert when the first magnitude and the second magnitude are substantially different.

11. The method of claim 8, wherein the providing the alert when the comparison of the first magnitude and the second magnitude indicate the presence of the coolant leak comprises:

providing the alert when the first magnitude and the second magnitude have abruptly changed from previous magnitudes.

12. The method of claim 8, wherein the providing the alert when the comparison of the first magnitude and the second magnitude indicate the presence of the coolant leak comprises:

providing the alert when at least one of the first magnitude and the second magnitude has changed, respectively, from a previous first magnitude and a previous second magnitude.

13. The method of claim 8, wherein the first magnitude is a first bin-1 magnitude and the second magnitude is a second bin-1 magnitude.

14. The method of claim 8 further comprising:

calibrating the first magnitude and the second magnitude with respect to a humidity measurement of a humidity sensor.

15. An apparatus comprising:

a transmitter circuit configured to provide a transmitted waveform at a transmitter output;

a first voltage divider circuit;

a second voltage divider circuit;

a first receiver circuit;

a second receiver circuit; and a processor, wherein the first voltage divider circuit includes:

a first microstrip differential trace extending from a first microstrip differential trace first end to a first microstrip differential trace second end; and a first impedance device having a first impedance device first end coupled to the transmitter output and a first impedance device second end coupled to the first microstrip differential trace first end;

wherein the second voltage divider circuit includes:

a second microstrip differential trace extending from a second microstrip differential trace first end to a second microstrip differential trace second end; and a second impedance device having a second impedance device first end coupled to the transmitter output and a second impedance device second end coupled to the second microstrip differential trace first end, wherein the first receiver circuit has a first receiver circuit input coupled to the first microstrip differential trace second end, the first receiver configured to provide a first received signal, wherein the second receiver circuit has a second receiver circuit input coupled to the second microstrip differential trace second end, the second receiver configured to provide a second received signal; and wherein the processor is configured to receive the first received signal and the second received signal and to perform digital signal processing on the first received signal and the second received signal, to detect a coolant leak, and to provide an alert upon detection of the coolant leak.

16. The apparatus of claim 15, further comprising:

a low-pass filter having a low-pass filter input and a low-pass filter output, the transmitter output coupled to the low-pass filter input, the low-pass filter output coupled to the first impedance device first end and to the second impedance device first end.

17. The apparatus of claim 15, wherein the first microstrip differential trace and the second microstrip differential trace are disposed on a coplanar surface of a circuit board.

18. The apparatus of claim 15, wherein the circuit board defines an aperture configured for the acceptance of a heat exchanger therein.

19. The apparatus of claim 15, wherein the transmitted waveform is periodic at a frequency of between 0.1 Hertz and 10 kiloHertz.

20. The apparatus of claim 15, wherein the transmitted waveform is periodic at a frequency of between 1 Hertz and 1000 Hertz.

* * * * *